(12) United States Patent
Lim et al.

(10) Patent No.: US 6,201,432 B1
(45) Date of Patent: Mar. 13, 2001

(54) INTEGRATED CIRCUIT DEVICES USING FUSE ELEMENTS TO GENERATE AN OUTPUT SIGNAL THAT IS INDEPENDENT OF CUT FUSE REMNANTS

(75) Inventors: Ki-Won Lim, Seoul; Eui-Gyu Han; Jeong-Un Choi, both of Kyunggi-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/315,695

(22) Filed: May 20, 1999

(30) Foreign Application Priority Data

May 29, 1998 (KR) .................................................. 98-19869

(51) Int. Cl.[7] ........................... H01H 37/76; H01H 85/00
(52) U.S. Cl. ............................................. 327/525; 327/526
(58) Field of Search ................................ 327/52, 66, 525, 327/526; 365/96, 225.7, 200

(56) References Cited

U.S. PATENT DOCUMENTS

| 4,446,534 | 5/1984 | Smith | 365/96 |
| 4,730,129 | 3/1988 | Kunitoki et al. | 307/362 |
| 4,773,046 | 9/1988 | Akaogi et al. | 365/96 |
| 5,291,139 | * 3/1994 | Fruhauf et al. | 324/550 |
| 5,428,311 | 6/1995 | McClure | 327/276 |
| 5,491,444 | 2/1996 | McClure | 327/525 |
| 5,701,274 | 12/1997 | Akaogi et al. | 365/230.01 |
| 5,726,585 | 3/1998 | Kim | 376/38 |
| 5,767,732 | 6/1998 | Lee et al. | 327/525 |
| 5,818,285 | 10/1998 | Lee et al. | 327/525 |
| 5,825,698 | * 10/1998 | Kim et al. | 365/200 |

* cited by examiner

Primary Examiner—Terry D. Cunningham
Assistant Examiner—Quan Tra
(74) Attorney, Agent, or Firm—Myers Bigel Sibley & Sajovec (57) ABSTRACT

Integrated circuit devices include a comparator circuit and a fuse programmable input circuit. The fuse programmable input circuit generates first and second differential input signals at voltage levels that can be controlled through a pair of fuses. The comparator circuit generates an output signal based on the relative voltage levels exhibited by the first and second differential input signals. In particular, the output signal is driven to a first logic state when the voltage difference between the first and second differential input signals is positive and the output signal is driven to a second logic state, which is opposite the first logic state, when the voltage difference is negative. Because the comparator is responsive to the relative difference between the voltage levels of the first and second differential input signals and not the absolute magnitudes of the voltage levels, fuse remnants that may exist after the fuse programmable input circuit has been programmed (i.e., one or more fuses have been cut) typically do not affect the output signal.

27 Claims, 5 Drawing Sheets

Fig. 1

(Prior Art)

Fig. 2

(Prior Art)

INTEGRATED CIRCUIT DEVICES USING FUSE ELEMENTS TO GENERATE AN OUTPUT SIGNAL THAT IS INDEPENDENT OF CUT FUSE REMNANTS

CROSS REFERENCE TO RELATED APPLICATION

This application claims the benefit of Korean Patent Application No. 98-19869, filed May 29, 1998, the disclosure of which is hereby incorporated herein by reference.

FIELD OF THE INVENTION

The present invention relates generally to the field of integrated circuit devices, and, more particularly, to fuse programmable integrated circuit devices.

BACKGROUND OF THE INVENTION

In some integrated circuit memory devices, different operating modes can be selected on the semiconductor chip before packaging. For example, a memory device may be capable of operating in various modes, such as page mode, nibble mode, burst mode, and static mode. In such a memory device, the desired operation mode may be chosen by cutting a predetermined fuse or set of fuses. In addition, fuses can be used to select among other options relating to, for example, propagation delay adjustment, pulse width adjustment, transistor width adjustment, and current level adjustment. Fuses can also be used to repair memory devices, including defective memory cells. Thus, broadly stated, a semiconductor device can be programmed to exhibit a certain set of characteristics or features by selectively cutting or leaving intact various fuse elements. To determine the status of a particular fuse, a fuse signature circuit can be used to determine if the fuse element is cut or intact.

The aforementioned applications for fuses are described, for example, in U.S. Pat. No. 4,446,534 entitled "PROGRAMMABLE FUSE CIRCUIT," U.S. Pat. No. 4,730,129 entitled "INTEGRATED CIRCUIT HAVING FUSE CIRCUIT," U.S. Pat. No. 4,773,046 entitled "SEMICONDUCTOR DEVICE HAVING FUSE CIRCUIT AND DETECTING CIRCUIT FOR DETECTING STATES OF FUSES IN THE FUSE CIRCUIT," U.S. Pat. No. 5,428,311 entitled "FUSE CIRCUITRY TO CONTROL THE PROPAGATION DELAY OF AN IC," U.S. Pat. No. 5,491,444 entitled "FUSE CIRCUIT WITH FEEDBACK DISCONNECT," U.S. Pat. No. 5,701,274 entitled "SEMICONDUCTOR DEVICE WITH SELECTABLE DEVICE INFORMATION," U.S. Pat. No. 5,726,585 entitled "SWITCHING CIRCUIT FOR USE INA SEMICONDUCTOR MEMORYDEVICE," U.S. Pat. No. 5,767,732 entitled "CIRCUIT FOR PERMANENTLY ADJUSTING A CIRCUIT ELEMENT VALUE IN A SEMICONDUCTOR INTEGRATED CIRCUIT USING FUSE ELEMENTS," and U.S. Pat. No. 5,818,285 entitled "FUSE SIGNATURE CIRCUITS FOR MICROELECTRONIC DEVICES."

Figure 1:
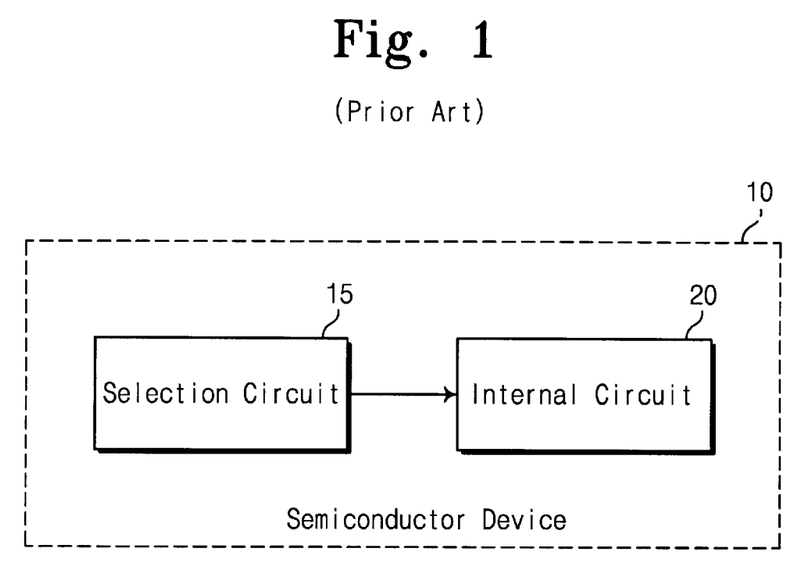
FIG. 1 is a block diagram of a semiconductor device including a selection circuit for controlling another circuit in accordance with the prior art.

In addition to these applications, fuse elements or fuse circuits have also been used to perform selection functions. With reference to FIG. 1, a conventional semiconductor device 10 is shown to comprise a selection circuit 15 and an internal circuit 20. The selection circuit 15 typically has at least one fuse element (not shown), and controls the operation of the internal circuit 20 in accordance with a fuse cutting operation.

Figure 2:
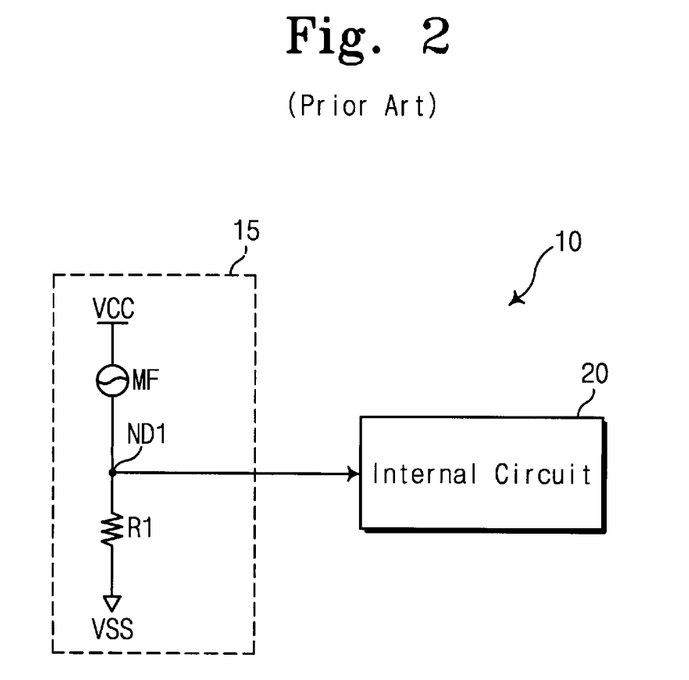
FIG. 2 is an electrical schematic of the selection circuit of FIG. 1.

A circuit diagram of the selection circuit 15 according to the prior art is shown in FIG. 2. The selection circuit 15 includes a master fuse MF, which is electrically connected between a power supply voltage VCC and an output terminal ND1, and a resistor R1, which is electrically connected between the output terminal ND1 and a ground or common voltage VSS. The master fuse MF typically comprises a laser fuse. Before the master fuse MF is cut, the output terminal ND 1 is driven to a logically high level (hereinafter logic one level) that is approximately equal to the power supply voltage VCC, which thereby activates the internal circuit 20. Conversely, after the master fuse MF is cut, the output terminal ND1 is pulled down to a logically low level (hereinafter logic zero level) that is approximately equal to the ground or common voltage VSS, which thereby deactivates the internal circuit 20.

If the master fuse MF is cut imperfectly, however, the operation of the internal circuit 20 and ultimately the semiconductor device 10 may not be reliably predicted. For example, after the master fuse MF is cut, remnants of the master fuse MF may act as a resistor. This may cause the voltage level at the output terminal NDI to fall between the standard logic one and logic zero voltage levels, which can cause the behavior of the internal circuit 20 to be indeterminate.

Consequently, there exists a need for improved integrated circuit devices that can be reliably programmed through the use of fuses.

SUMMARY OF THE INVENTION

It is therefore an object of the present invention to provide improved fuse programmable integrated circuit devices.

It is another object of the present invention to provide fuse programmable integrated circuit devices that can generate selection signals for controlling other circuits or devices with reduced susceptibility to fuse remnant defects.

These and other objects, advantages, and features of the present invention are provided by integrated circuit devices that include a comparator circuit and a fuse programmable input circuit. The fuse programmable input circuit generates first and second differential input signals at voltage levels that can be controlled through a pair of fuses. The comparator circuit generates an output signal based on the relative voltage levels exhibited by the first and second differential input signals. In particular, the output signal is driven to a first logic state when the voltage difference between the first and second differential input signals is positive and the output signal is driven to a second logic state, which is opposite the first logic state, when the voltage difference is negative.

Because the comparator is responsive to the relative difference between the voltage levels of the first and second differential input signals and not the absolute magnitudes of the voltage levels, fuse remnants that may exist after the fuse programmable input circuit has been programmed (i.e., one or more fuses have been cut) typically do not affect the output signal.

In accordance with an aspect of the invention, the fuse programmable input circuit may include a pair of voltage divider circuits that generate the first and second differential input signals. In accordance with another aspect of the invention, the comparator circuit may include a differential amplifier circuit.

Integrated circuit decoding devices according to the present invention include a redundant address generator that is operatively connected to a selection circuit. The redundant address generator includes a plurality of fuses that can be selectively cut to prevent signals from passing therethrough to reach an output terminal.

In accordance with an aspect of the invention, the selection circuit generates a control signal through a comparator circuit and a fuse programmable input circuit. The fuse programmable input circuit generates first and second differential input signals at voltage levels that can be controlled through a pair of fuses. The comparator circuit generates the control signal based on the relative voltage levels exhibited by the first and second differential input signals. In particular, the output signal is driven to a first logic state when the voltage difference between the first and second differential input signals is positive and the output signal is driven to a second logic state, which is opposite the first logic state, when the voltage difference is negative.

Thus, the redundant address generator, which can implement a decoding function through selective cutting of the appropriate fuses, can be activated or deactivated via the control signal from the selection circuit. Moreover, the control signal can be reliably controlled through the fuse programmable input circuit. In particular, the control signal is typically unaffected by fuse remnants that may remain after the fuse programmable input circuit is programmed.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

Figure 3:
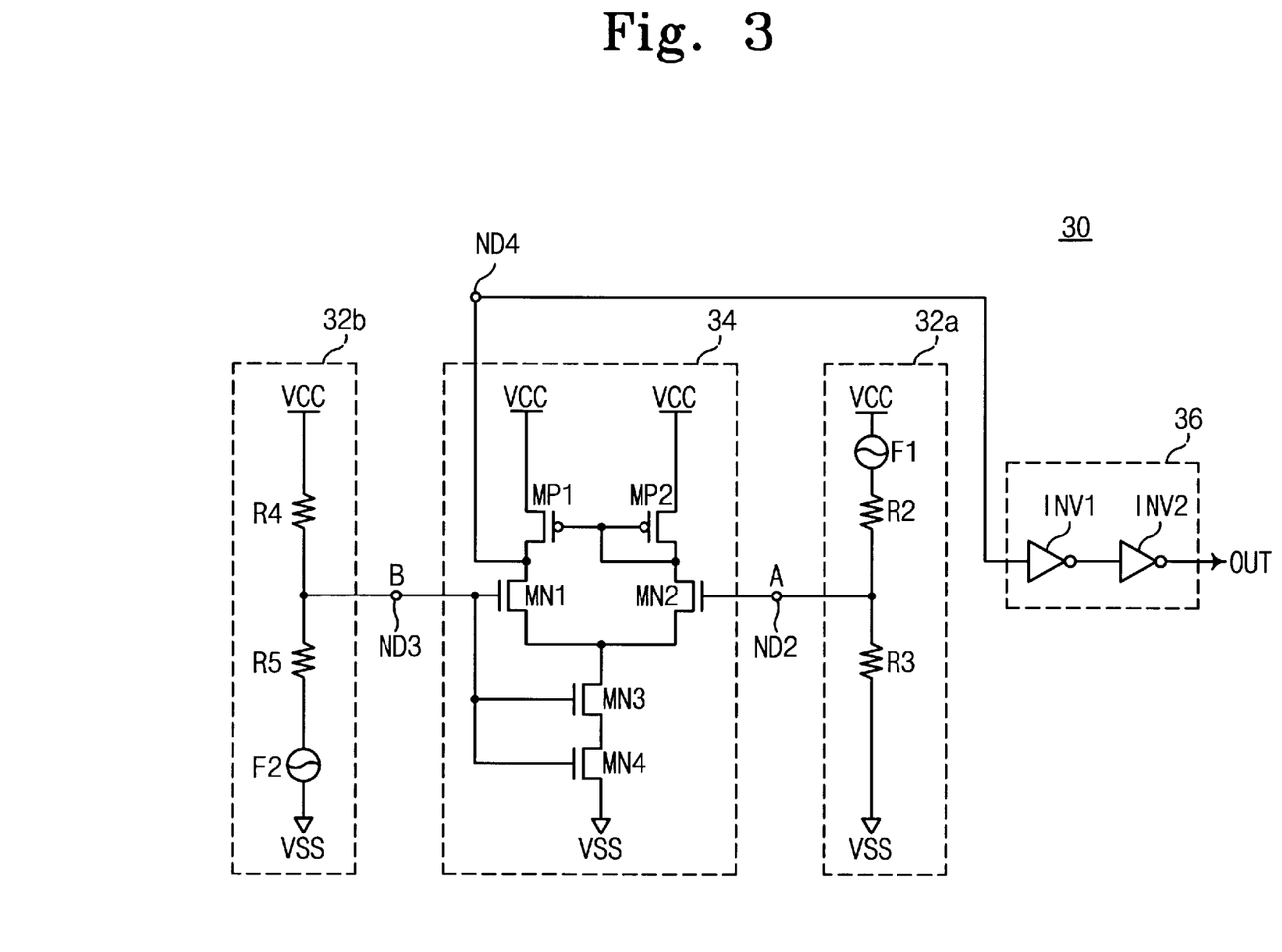
FIG. 3 is an electrical schematic of a selection circuit in accordance with the present invention.

Referring now to FIG. 3, a preferred embodiment of a selection circuit 30, according to the present invention, is shown as comprising a fuse programmable input circuit 32a, 32b and a comparator circuit 34. The selection circuit 30 generates a selection or output signal at an output terminal ND4, which can be used to control the operation of another circuit (e.g., internal circuit 20 of FIG. 2). In particular, the selection signal exhibits a logic one voltage level before a pair of fuses F1 and F2 are cut and exhibits a logic zero voltage level after the fuses F1 and F2 are cut.

The comparator circuit 34 comprises a differential amplifier circuit having first and second input terminals ND2 and ND3 and the output terminal ND4. The comparator circuit 34 compares a difference between the voltage levels on the first and second input terminals ND2 and ND3 and generates the selection signal as the comparison result. The comparator circuit 34 includes two PMOS transistors MP1 and MP2 and four NMOS transistors MN1 through MN4 configured as follows: The PMOS transistor MP1 has its source electrode electrically connected to the power supply voltage VCC and its drain electrode electrically coupled to the drain electrode of NMOS transistor MN1 at the output terminal ND4. The PMOS transistor MP2 has its source electrode electrically connected to the power supply voltage VCC and its gate and drain electrodes commonly tied to both the gate electrode of the PMOS transistor MP1 and the drain electrode of the NMOS transistor MN2. The PMOS transistors MP1 and MP2 act as a current mirror and preferably have similar characteristics.

The NMOS transistors MN1 and MN2 act as input transistors and preferably have similar characteristics. The source electrodes of transistors MN1 and MN2 are electrically connected together and are also electrically connected to the drain electrode of transistor MN3. Transistor MN4 is connected in series between transistor MN3 and a ground or common voltage VSS. More specifically, the drain electrode of transistor MN4 is electrically connected to the source electrode of transistor MN3 and the source electrode of transistor MN4 is electrically connected to the ground or common voltage VSS. The gate electrode of transistor MN2 serves as a first input terminal ND2. The gate electrodes of transistors MN1, MN3, and MN4 are electrically connected together to serve as a second input terminal ND3.

Continuing to refer to FIG. 3, the fuse programmable input circuit comprises a first voltage divider circuit 32a that is electrically connected to the comparator circuit 34 and divides the power supply voltage VCC to generate a first division voltage A at the first input terminal ND2. The first voltage divider circuit 32a includes two resistors R2 and R3 and one fuse F1 connected in series between the power supply voltage VCC and the ground or common voltage VSS. The fuse F1 may be formed as a laser fuse (i.e., fabricated by use of polysilicon). The resistor R2 has one terminal electrically connected to the power supply voltage VCC through the fuse F1 and the other terminal electrically connected to the first input terminal ND2. The resistor R3 has one terminal electrically connected to the first input terminal ND2 and the other terminal electrically connected to the ground or common voltage VSS.

The fuse programmable input circuit further comprises a second voltage divider circuit 32b that is electrically connected to the comparator circuit 34 and divides the power supply voltage VCC to generate a second division voltage B at the second input terminal ND3. The second voltage divider circuit 32b includes two resistors R4 and R5 and one fuse F2 connected in series between the power supply voltage VCC and the ground or common voltage VSS. The fuse F2 may be formed as a laser fuse (i.e., fabricated by use of polysilicon). The resistor R4 has one terminal electrically connected to the power supply voltage VCC and the other terminal electrically connected to the second input terminal ND3. The resistor R5 has one terminal electrically connected to the second input terminal ND3 and the other terminal electrically connected to the ground voltage VSS through the fuse F2.

The selection circuit 30 may further comprise a buffer circuit 36 electrically connected to the output terminal ND4 and comprising two inverters INV1 and INV2 connected in series. The buffer circuit 36 can be used to amplify the voltage level of the selection signal at the output terminal ND4 to a logic one voltage level (e.g., the power supply voltage level VCC) or to a logic zero level (e.g., the ground or common voltage level VSS). This amplified version of the selection signal is designated as the OUT signal in FIG. 3.

Figure 4A:
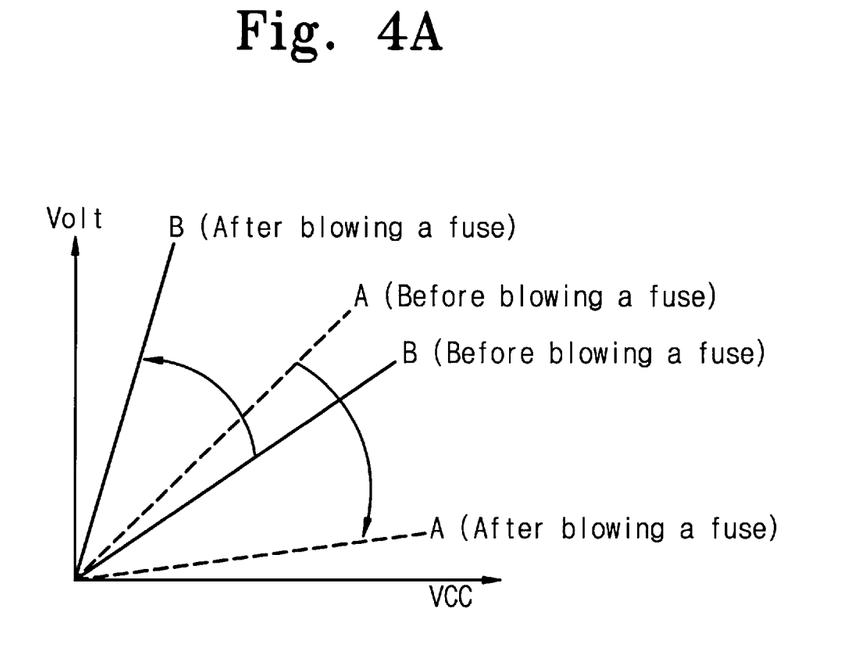
FIG. 4A is a graphical representation of the input voltages generated by two fuse programmable voltage divider circuits used in the selection circuit of FIG. 3 before and after the fuses are cut.

In a preferred embodiment, the values of the resistors R2 through R5 are chosen so that the first division voltage A is higher than the second division voltage B before the fuses F1 and F2 are cut, and the first division voltage A is less than the second division voltage B after the fuses F1 and F2 are cut. Moreover, through careful selection of the resistance values for resistors R2 through R5, the relationship between the first and second division voltages A and B can be reversed after the fuses F1 and F2 are cut as shown in FIG. 4A. That is, after the fuses are cut, the second division voltage B is greater than the first division voltage A when the power supply voltage VCC is greater than the ground or common voltage VSS.

The resistors R2 through R5 preferably comprise linear circuit elements, which ensures that the first and second division voltages A and B will vary linearly in accordance with the power supply voltage level VCC. Moreover, as illustrated in FIG. 4A, the relationship between the first and second division voltages A and B (i.e., which division voltage is greater than the other) is also maintained as the power supply voltage VCC is increased from the ground or common voltage level VSS.

Figure 4B:
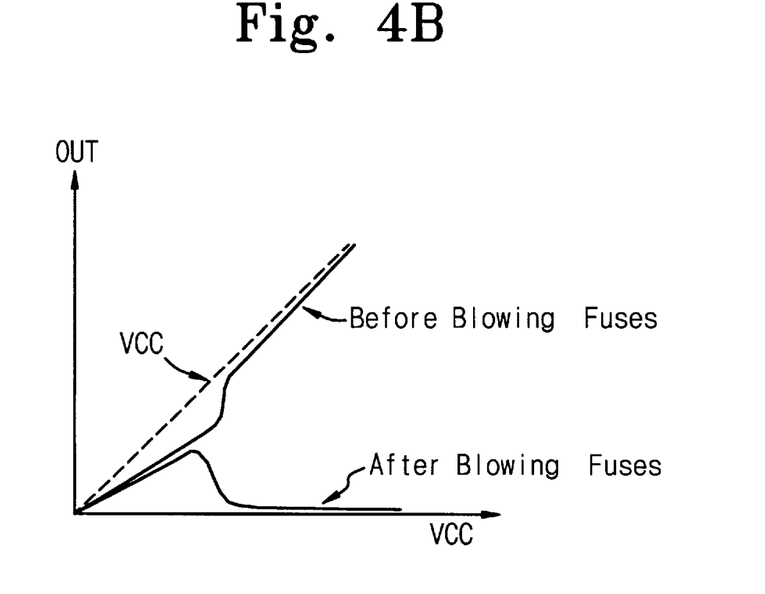
FIG. 4B is a graphical representation of a selection signal generated by the selection circuit of FIG. 3.

The operation of the selection circuit 30 is described hereafter. Before the fuses F1 and F2 are cut, the first input terminal ND2 is maintained at a logic one voltage level and the second input terminal ND3 is maintained at a logic zero voltage level due to the values selected for resistors R2 through R5 and application of a predetermined power supply voltage VCC. When the fuse programmable input circuit 32a,b is programmed to a first state in which the fuses F1 and F2 are intact, the comparator circuit 34 generates a logically high voltage level at the output terminal ND4. The buffer circuit 36 may then be used to amplify the voltage level exhibited at the output terminal ND4 to a full logic one level corresponding approximately to the power supply voltage VCC as shown in FIG. 4B.

After the fuses F1 and F2 are cut, the first input terminal ND2 is maintained at a logic zero voltage level and the second input terminal ND3 is maintained at a logic one voltage level. That is, after the fuses F1 and F2 are cut, the voltage levels on the first and second input terminals ND2 and ND3 are logically reversed from their previous state when the fuses were intact. As a result of the fuse cutting procedure, remnants of the fuses F1 and F2 may be produced that are electrically conductive and thus have some resistance. Thus, it may not be possible to model the cut fuses as open circuits. Nevertheless, the values of the resistors R2 through R5 can be selected such that the effective impedance of R2 and the remnants of fuse F1, and R5 and the remnants of fuse F2, are greater than the impedances of R3 and R4 respectively. When the fuse programmable input circuit 32a, 32b is programmed to this second state in which the fuses F1 and F2 are cut, the comparator circuit 34 generates a logically low voltage level at the output terminal ND4. The buffer circuit 36 may then be used to amplify the voltage level exhibited at the output terminal ND4 to a full logic zero level corresponding approximately to the ground or common voltage VSS as shown in FIG. 4B.

Advantageously, the selection circuit 30 according to the present invention provides improved reliability as remnants that may remain from programming the selection circuit 30 (i.e., cutting the fuses F1 and F2) will typically not affect the selection signal generated at the output terminal ND4.

Figure 5:
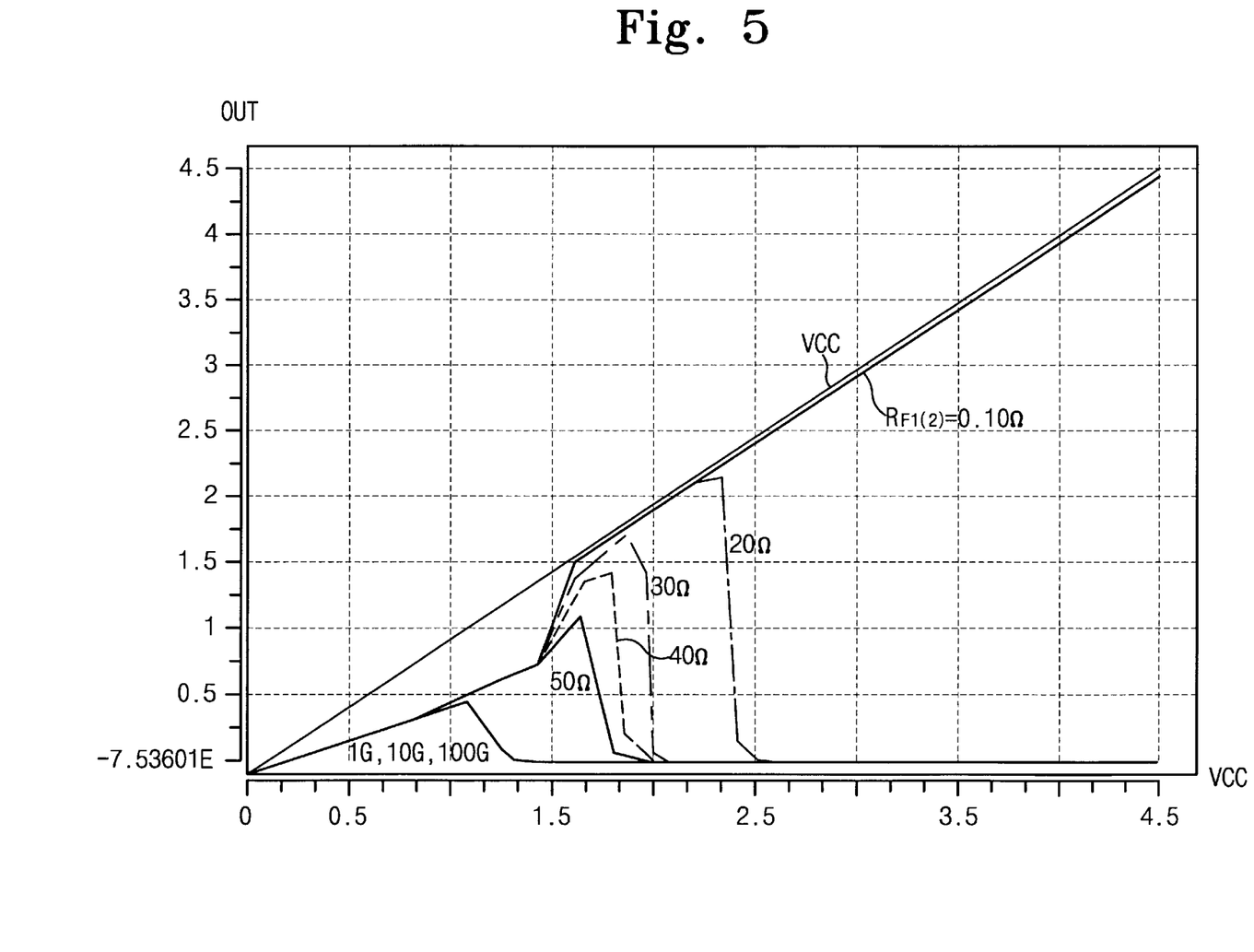
FIG. 5 is a graphical representation of the selection signal generated by the selection circuit of FIG. 3 for several different values of resistance introduced by fuse remnants that may be produced after the fuses are cut.

FIG. 5 provides a graph of the selection signal OUT versus the power supply voltage VCC for a variety of resistance values assigned to the remnants of fuses F1 and F2. In the examples shown, when the fuses F1 and F2 are intact, they exhibit a nominal resistance of 0.10 Ω. Assuming the remnants of the fuses F1 and F2 each act as a resistor of 20 Ω, the selection signal OUT is driven to a logic zero level at a power supply voltage level of 2.5 volts. As illustrated by the examples, even if the fuses F1 and F2 are cut imperfectly (i.e., the remnants act as a resistor), the selection signal OUT can still be reliably controlled for typical power supply voltage levels.

A selection circuit 30 in accordance with the present invention can be used in a variety of applications. One such application is in a redundancy decoding circuit. Typically, a semiconductor memory device includes redundant memory cells, which are substituted for defective memory cells in the device. To substitute a redundant memory cell for a defective memory cell, a redundancy decoding circuit is used to generate a redundant address, which designates the substituted redundant memory cell instead of the defective memory cell. A circuit diagram of a redundancy decoding circuit 40 incorporating the selection circuit 30 of the present invention is shown in FIG. 6.

Figure 6:
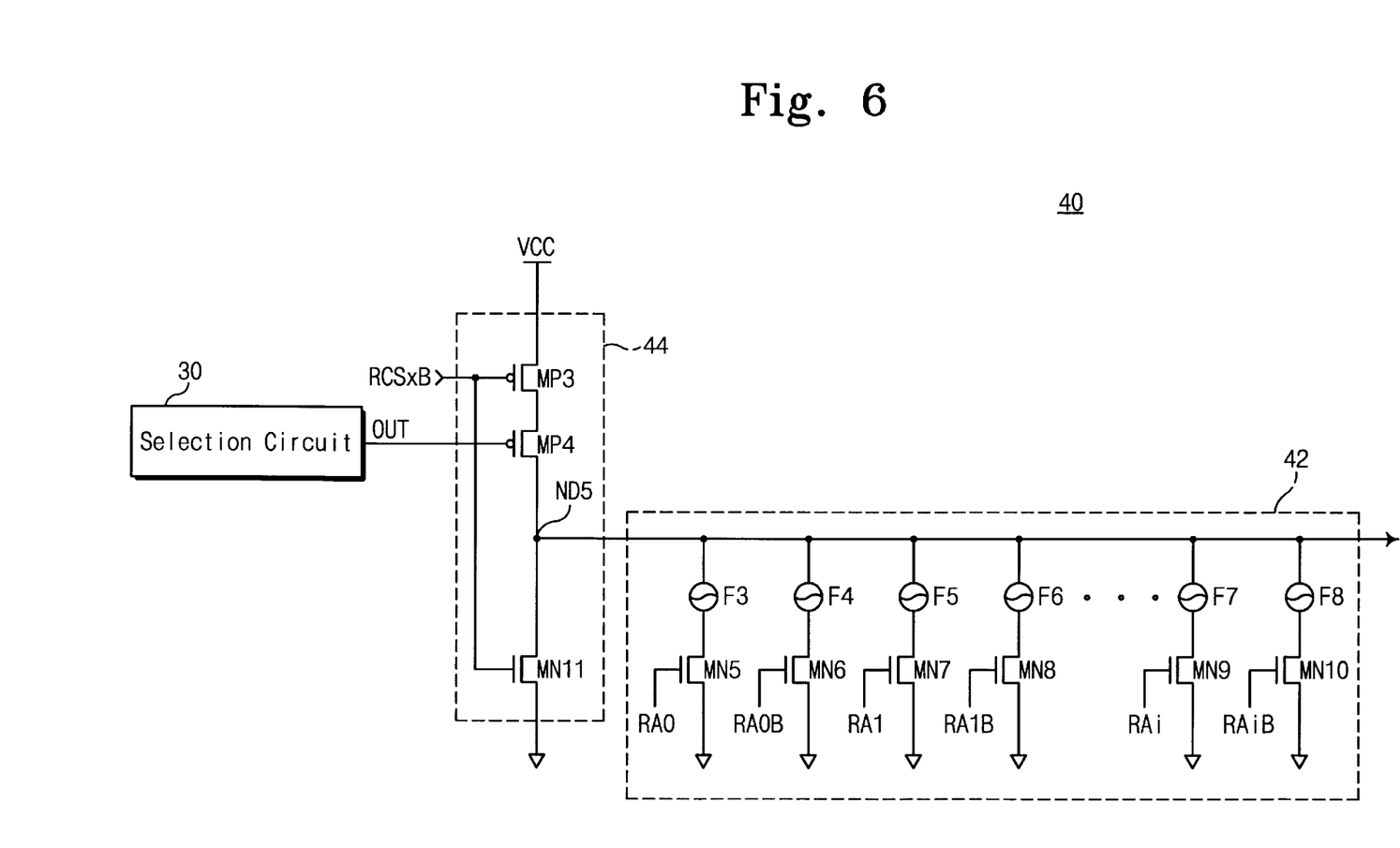
FIG. 6 is a schematic diagram of a redundancy circuit incorporating the selection circuit of FIG. 3 in accordance with the present invention.

With reference to FIG. 6, a redundancy decoding circuit 40, in accordance with the present invention, comprises a selection circuit 30 and a redundant address generator 42. The selection circuit 30 was described hereinabove with reference to FIG. 3. The redundant address generator 42 includes a series of NMOS transistors MN5 through MN10 that have their drain electrodes electrically connected to an output terminal ND5 through a series of fuses F3 through F8 respectively. The transistors MN5 through MN10 receive redundant address signals, RA0, RA0B through RAi, RAiB, at their gate electrodes respectively. By selectively cutting or leaving intact the fuses F3 through F8, the redundant address signals can either be blocked or passed through to the output terminal ND5. Thus, the redundant address generator 42 can be programmed to operate as a decoder for the redundant address signals RA0, RA0B through RAi, RAiB.

As shown in FIG. 6, the redundancy decoding circuit 40 may also include a driving unit 44, which is comprised of PMOS transistors MP3 and MP4 and NMOS transistor MN11 and supplies a driving current to the output terminal ND5 of the redundant address generator 42. A signal RCSxB can be applied in common to the gate electrodes of the PMOS transistors MP3 and the NMOS transistor MN11 to activate or deactivate the driving unit 44. In the embodiment illustrated in FIG. 6, the signal RCSxB is driven to a logic zero level to activate the driving unit 44 when decoding redundant address signals.

The selection circuit 30, sometimes referred to as "a switching control signal generator" or "an enable fuse circuit," allows the driving unit 44 to drive the redundant address generator 42 by applying a control signal OUT to the gate of the PMOS transistor MP4. As discussed hereinbefore, the selection circuit 30 can be programmed to generate the control signal OUT by cutting or leaving intact fuses contained therein. Moreover, the control signal OUT is typically unaffected by any fuse remnants that may remain from the fuse cutting operation. Consequently, the reliability of the redundancy decoding circuit is improved as the control signal OUT can be reliably driven to a desired logic level where it can be maintained.

In concluding the detailed description, it should be noted that many variations and modifications can be made to the preferred embodiment without substantially departing from the principles of the present invention. All such variations and modifications are intended to be included herein within the scope of the present invention, as set forth in the following claims.

We claim:

1. An integrated circuit device, comprising:
   a fuse programmable input circuit that generates first and second differential input signals at voltage levels that are controlled by states of first and second fuses therein, the fuse programmable input circuit comprising:
   a first voltage divider circuit that comprises the first fuse and generates the first differential input signal;
   a second voltage divider circuit that comprises the second fuse and generates the second differential input signal; and
   a comparator circuit that is responsive to the first and second differential input signals and generates an output signal in a first logic state when a voltage difference between the first and second differential input signals is positive and in a second logic state, opposite the first logic state, when the voltage difference is negative.

2. An integrated circuit device as recited in claim 1, wherein the voltage level of the first differential input signal is greater than the voltage level of the second differential input signal when the first and second fuses are intact and the voltage level of the first differential input signal is less than the voltage level of the second differential input signal when the first and second fuses are cut.

3. An integrated circuit device as recited in claim 1, wherein the first voltage divider circuit comprises:
   a first resistor connected to a power supply through a series connection with the first fuse; and
   a second resistor connected in series with the first resistor at a first junction that generates the first differential input signal.

4. An integrated circuit device as recited in claim 1, wherein the second voltage divider circuit comprises:
   a first resistor and a second resistor connected in series at a first junction that generates the second differential input signal between a power supply and the second fuse.

5. An integrated circuit device as recited in claim 1, wherein the first and second fuses are laser fuses.

6. An integrated circuit device as recited in claim 1, wherein the comparator circuit comprises a differential amplifier circuit.

7. An integrated circuit device as recited in claim 1, further comprising a buffer circuit that amplifies the output signal.

8. An integrated circuit device as recited in claim 7, wherein the buffer circuit comprises a pair of inverter circuits connected in series.

9. An integrated circuit decoding device, comprising:
   a selection circuit that generates a control signal, the selection circuit comprising:
   a fuse programmable input circuit that generates first and second differential input signals at voltage levels that are controlled by states of first and second fuses therein;
   a comparator circuit that is responsive to the first and second differential input signals and generates the control signal in a first logic state when a voltage difference between the first and second differential input signals is positive and in a second logic state, opposite the first logic state when the voltage difference is negative; and
   a redundant address generator, responsive to the control signal, that includes a plurality of fuses that can be selectively cut to prevent signals carried therethrough from reaching an output terminal.

10. An integrated circuit decoding device as recited in claim 9, further comprising a current driving circuit electrically connecting the selection circuit to the output terminal.

11. An integrated circuit decoding device as recited in claim 9, wherein the fuse programmable input circuit comprises:
    a first voltage divider circuit that comprises the first fuse and generates the first differential input signal; and
    a second voltage divider circuit that comprises the second fuse and generates the second differential input signal.

12. An integrated circuit device as recited in claim 11, wherein the voltage level of first differential input signal is greater than the voltage level of the second differential input signal when the first and second fuses are intact and the voltage level of the first differential input signal is less than the voltage level of the second differential input signal when the first and second fuses are cut.

13. An integrated circuit decoding device as recited in claim 11, wherein the first voltage divider circuit comprises:
    a first resistor connected to a power supply through a series connection with the first fuse; and
    a second resistor connected in series with the first resistor at a first junction that generates the first differential input signal.

14. An integrated circuit decoding device as recited in claim 11, wherein the second voltage divider circuit comprises:
    a first resistor and a second resistor connected in series at a first junction that generates the second differential input signal between a power supply and the second fuse.

15. An integrated circuit decoding device as recited in claim 9, wherein the first and second fuses are laser fuses.

16. An integrated circuit decoding device as recited in claim 9, wherein the comparator circuit comprises a differential amplifier circuit.

17. An integrated circuit decoding device as recited in claim 9, further comprising a buffer circuit that amplifies the control signal.

18. An integrated circuit decoding device as recited in claim 17, wherein the buffer circuit comprises a pair of inverter circuits connected in series.

19. An integrated circuit device, comprising:
    a fuse programmable input circuit that generates first and second differential input signals at voltage levels that are controlled by states of first and second fuses therein, the states comprising an intact state in which the first and second fuses are both intact and a cut state in which the first and second fuses are both cut; and
    a comparator circuit that is responsive to the first and second differential input signals and generates an output signal in a first logic state when a voltage difference between the first and second differential input signals is positive and in a second logic state, opposite the first logic state, when the voltage difference is negative.

20. An integrated circuit device as recited in claim 19, wherein the fuse programmable input circuit comprises:
  a first voltage divider circuit that comprises the first fuse and generates the first differential input signal; and
  a second voltage divider circuit that comprises the second fuse and generates the second differential input signal.

21. An integrated circuit device as recited in claim 20, wherein the voltage level of the first differential input signal is greater than the voltage level of the second differential input signal when the first and second fuses are intact and the voltage level of the first differential input signal is less than the voltage level of the second differential input signal when the first and second fuses are cut.

22. An integrated circuit device as recited in claim 20, wherein the first voltage divider circuit comprises:
  a first resistor connected to a power supply through a series connection with the first fuse; and
  a second resistor connected in series with the first resistor at a first junction that generates the first differential input signal.

23. An integrated circuit device as recited in claim 20, wherein the second voltage divider circuit comprises:
  a first resistor and a second resistor connected in series at a first junction that generates the second differential input signal between a power supply and the second fuse.

24. An integrated circuit device as recited in claim 19, wherein the first and second fuses are laser fuses.

25. An integrated circuit device as recited in claim 19, wherein the comparator circuit comprises a differential amplifier circuit.

26. An integrated circuit device as recited in claim 19, further comprising a buffer circuit that amplifies the output signal.

27. An integrated circuit device as recited in claim 26, wherein the buffer circuit comprises a pair of inverter circuits connected in series.

* * * * *